United States Patent
Das et al.

(10) Patent No.: US 8,433,944 B2
(45) Date of Patent: Apr. 30, 2013

(54) CLOCK DIVIDER SYSTEM AND METHOD WITH INCREMENTAL ADJUSTMENT STEPS WHILE CONTROLLING TOLERANCE IN CLOCK DUTY CYCLE

(75) Inventors: Srinjoy Das, San Diego, CA (US); Haikun Zhu, San Diego, CA (US); Kevin R. Bowles, Mission Viejo, CA (US); Matthew L. Severson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 441 days.

(21) Appl. No.: 12/758,374

(22) Filed: Apr. 12, 2010

(65) Prior Publication Data
US 2011/0248764 A1 Oct. 13, 2011

(51) Int. Cl.
*G06F 1/00* (2006.01)
(52) U.S. Cl.
USPC .......................................... 713/500; 713/600
(58) Field of Classification Search .................. 713/500, 713/600
See application file for complete search history.

(56) References Cited

U.S. PATENT DOCUMENTS

| | | | |
|---|---|---|---|
| 4,599,579 A | 7/1986 | McCann | |
| 4,602,219 A | 7/1986 | Underhill et al. | |
| 5,332,978 A | 7/1994 | Yabuki et al. | |
| 5,412,349 A | 5/1995 | Young et al. | |
| 5,625,279 A | 4/1997 | Rice et al. | |
| 5,828,868 A | 10/1998 | Sager et al. | |
| 5,889,436 A | 3/1999 | Yeung et al. | |
| 5,970,110 A | 10/1999 | Li | |
| 6,559,698 B1 * | 5/2003 | Miyabe | 327/157 |
| 6,748,408 B1 | 6/2004 | Bredin et al. | |
| 6,807,552 B2 | 10/2004 | Bredin et al. | |
| 6,836,526 B2 | 12/2004 | Rana | |
| 6,861,881 B1 | 3/2005 | Neravetla et al. | |
| 6,956,922 B2 | 10/2005 | Weldon et al. | |
| 7,176,738 B1 | 2/2007 | Hwang et al. | |
| 7,467,319 B1 * | 12/2008 | Kao et al. | 713/500 |
| 7,944,265 B2 * | 5/2011 | Lam et al. | 327/291 |
| 7,982,552 B2 * | 7/2011 | Shin et al. | 331/177 R |
| 8,004,324 B2 * | 8/2011 | Tajima et al. | 327/156 |
| 2005/0242851 A1 | 11/2005 | Booth et al. | |
| 2009/0278611 A1 | 11/2009 | Cloutier et al. | |

FOREIGN PATENT DOCUMENTS

DE 19855367 A1 6/2000

OTHER PUBLICATIONS

International Search Report and Written Opinion—PCT/US2011/031170—ISA/EPO—Jun. 1, 2011.

* cited by examiner

*Primary Examiner* — Chun Cao
(74) *Attorney, Agent, or Firm* — Nicholas J. Pauley; Peter Michael Kamarchik; Joseph Agusta (57) ABSTRACT

In a particular embodiment, a single step increment calculation module is responsive to a first ramp control value and a second ramp control value. The single step increment calculation module generates a single step frequency adjustment as an output. The generated single step frequency adjustment is applied to a system clock signal having a first frequency to change the system clock signal to a second clock signal having a second frequency. The first frequency is different from the second frequency and the system clock signal has a first duty cycle that is within a tolerance range of a second duty cycle of the second clock signal.

35 Claims, 9 Drawing Sheets

| M | | | | | | | | Mulitpliers | | | | | | | | |
|---|---|---|---|---|---|---|---|---|---|---|---|---|---|---|---|---|
| 15 | 15.000 | 7.500 | 5.000 | 3.750 | 3.000 | 2.500 | 2.143 | 1.875 | 1.667 | 1.500 | 1.364 | 1.250 | 1.154 | 1.071 | 1.000 |
| 14 | 14.000 | 7.000 | 4.667 | 3.500 | 2.800 | 2.333 | 2.000 | 1.750 | 1.556 | 1.400 | 1.273 | 1.167 | 1.077 | 1.000 | 0.933 |
| 13 | 13.000 | 6.500 | 4.333 | 3.250 | 2.600 | 2.167 | 1.857 | 1.625 | 1.444 | 1.300 | 1.182 | 1.083 | 1.000 | 0.929 | 0.867 |
| 12 | 12.000 | 6.000 | 4.000 | 3.000 | 2.400 | 2.000 | 1.714 | 1.500 | 1.333 | 1.200 | 1.091 | 1.000 | 0.923 | 0.857 | 0.800 |
| 11 | 11.000 | 5.500 | 3.667 | 2.750 | 2.200 | 1.833 | 1.571 | 1.375 | 1.222 | 1.100 | 1.000 | 0.917 | 0.846 | 0.786 | 0.733 |
| 10 | 10.000 | 5.000 | 3.333 | 2.500 | 2.000 | 1.667 | 1.429 | 1.250 | 1.111 | 1.000 | 0.909 | 0.833 | 0.769 | 0.714 | 0.667 |
| 9 | 9.000 | 4.500 | 3.000 | 2.250 | 1.800 | 1.500 | 1.286 | 1.125 | 1.000 | 0.900 | 0.818 | 0.750 | 0.692 | 0.643 | 0.600 |
| 8 | 8.000 | 4.000 | 2.667 | 2.000 | 1.600 | 1.333 | 1.143 | 1.000 | 0.889 | 0.800 | 0.727 | 0.667 | 0.615 | 0.571 | 0.533 |
| 7 | 7.000 | 3.500 | 2.333 | 1.750 | 1.400 | 1.167 | 1.000 | 0.875 | 0.778 | 0.700 | 0.636 | 0.583 | 0.538 | 0.500 | 0.467 |
| 6 | 6.000 | 3.000 | 2.000 | 1.500 | 1.200 | 1.000 | 0.857 | 0.750 | 0.667 | 0.600 | 0.545 | 0.500 | 0.462 | 0.429 | 0.400 |
| 5 | 5.000 | 2.500 | 1.667 | 1.250 | 1.000 | 0.833 | 0.714 | 0.625 | 0.556 | 0.500 | 0.455 | 0.417 | 0.385 | 0.357 | 0.333 |
| 4 | 4.000 | 2.000 | 1.333 | 1.000 | 0.800 | 0.667 | 0.571 | 0.500 | 0.444 | 0.400 | 0.364 | 0.333 | 0.308 | 0.286 | 0.267 |
| 3 | 3.000 | 1.500 | 1.000 | 0.750 | 0.600 | 0.500 | 0.429 | 0.375 | 0.333 | 0.300 | 0.273 | 0.250 | 0.231 | 0.214 | 0.200 |
| 2 | 2.000 | 1.000 | 0.667 | 0.500 | 0.400 | 0.333 | 0.286 | 0.250 | 0.222 | 0.200 | 0.182 | 0.167 | 0.154 | 0.143 | 0.133 |
| 1 | 1.000 | 0.500 | 0.333 | 0.250 | 0.200 | 0.167 | 0.143 | 0.125 | 0.111 | 0.100 | 0.091 | 0.083 | 0.077 | 0.071 | 0.067 |
| N -> | 1 | 2 | 3 | 4 | 5 | 6 | 7 | 8 | 9 | 10 | 11 | 12 | 13 | 14 | 15 |

CLOCK DIVIDER SYSTEM AND METHOD WITH INCREMENTAL ADJUSTMENT STEPS WHILE CONTROLLING TOLERANCE IN CLOCK DUTY CYCLE

I. FIELD

The present disclosure is generally related to a system and method of a clock divider.

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and IP telephones, can communicate voice and data packets over wireless networks. Further, many such wireless telephones include other types of devices that are incorporated therein. For example, a wireless telephone can also include a digital still camera, a digital video camera, a digital recorder, and an audio file player. Often, switching from one device to another or one process of a device to another process of the same device sometimes requires one or more transitions between processor clock frequencies. If there is a sudden change or changes in the rate of current supply while switching from one clock frequency to another, the resulting voltage drop could lead to a functional failure of the device.

III. SUMMARY

A clock divider is disclosed that can adjust a system clock signal from a first frequency to a second frequency using a series of incremental adjustment steps. The incremental adjustment steps can be controlled to ensure that a duty cycle of the first frequency is within a tolerance range of a duty cycle of the second frequency. In a particular embodiment, the incremental adjustment steps can be controlled to ensure that a pulse width of the first frequency and a pulse width of the second frequency satisfy a minimum pulse width tolerance range.

In one embodiment, an apparatus includes a first input to receive an initial first ramp control value and an initial second ramp control value and a second input to receive a target first ramp control value and a target second ramp control value. The initial first ramp control value, the initial second ramp control value, the target first ramp control value, and the target second ramp control value collectively define a desired ramp control adjustment of a system clock signal. The apparatus includes a single step increment calculation module that is responsive to the first ramp control values and the second ramp control values and generates a single step frequency adjustment as an output. The single step frequency adjustment is calculated from the first ramp control value stored in a temporary first ramp control value register and a calculated second ramp control value stored in a temporary second ramp control value register. In a particular embodiment, an interval counter is used to determine when to change the first ramp control value or the second ramp control value to generate the single step frequency adjustment. The generated single step frequency adjustment is applied to a system clock signal having a first frequency to change the system clock signal to a second clock signal having a second frequency. The first frequency is different from the second frequency and the system clock signal has a first duty cycle that is within a tolerance range of a second duty cycle of the second signal. In a particular embodiment, the tolerance range is less than about fifty percent.

In a particular embodiment, the single step increment calculation module generates a second single step frequency adjustment and the second single step frequency adjustment is applied to the system clock signal to generate a third signal having a third frequency where the third signal has a third duty cycle within the tolerance range of the second duty cycle. In another particular embodiment, a frequency ramp complete logic circuit is used to determine when the temporary first and second ramp control values have reached the target ramp control values. In a particular embodiment, the first ramp control value is an M value and the second ramp control value is an N value and only the M value or the N value changes at any one time. In another particular embodiment, the first ramp control value and the second ramp control value are obtained using a Manhattan algorithm. In another particular embodiment, an interval counter is used to determine when to change the first ramp control value or the second ramp control value to generate the single step frequency adjustment.

One particular advantage provided by the disclosed embodiments is that when there are one or more transitions between clock frequencies, the duty cycle and/or pulse width of each change is within a tolerance range. As a result, a voltage drop that could lead to a functional failure of the device is potentially avoided.

Other aspects, advantages, and features of the present disclosure will become apparent after review of the entire application, including the following sections: Brief Description of the Drawings, Detailed Description, and the Claims.

V. DETAILED DESCRIPTION

Figure 1:
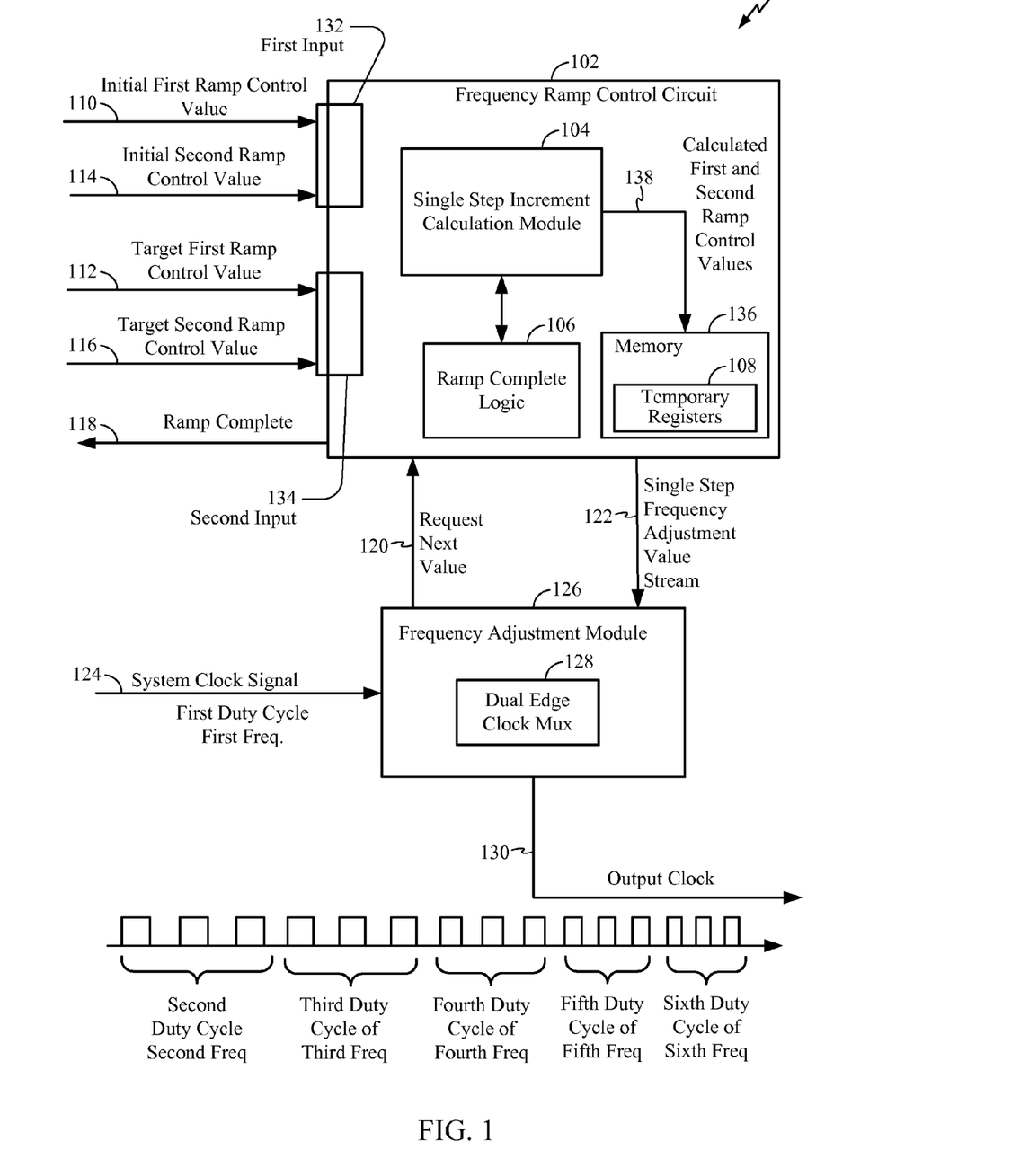
FIG. 1 is a block diagram of an illustrative embodiment of a system to fractionally divide a clock signal.

Referring to FIG. 1 an illustrative embodiment of a system to fractionally divide a clock signal is depicted and generally designated 100. The system 100 includes a frequency ramp control circuit 102 and a frequency adjustment module 126.

The frequency ramp control circuit 102 includes a first input 132, a second input 134, a single step increment calculation module 104, ramp complete logic 106, and memory 136 that contains temporary registers 108. The frequency adjustment module 126 contains dual edge clock mux 128. The first input 132 receives an initial first ramp control value 110 and an initial second ramp control value 114. The second input 134 receives a target first ramp control value 112 and a target second ramp control value 116. The initial first ramp control value 110, the initial second ramp control value 114, the target first ramp control value 112, and the target second ramp control value 116 collectively define a desired ramp control adjustment of a system clock signal 124.

The single step increment calculation module 104 is responsive to the initial first ramp control value 110 and the initial second ramp control value 114 and performs a frequency adjustment calculation to calculate a temporary first and second ramp control value. The calculated temporary first and second ramp control values are sent via signal 138 to the memory 136 for storage in the temporary registers 108 until the values are requested by the frequency adjustment module 126. The temporary first and second ramp control values together comprise a frequency adjustment value that can be used on the system clock signal 124 to create an output clock signal 130.

When the frequency adjustment module 126 sends a request next value signal 120 to the frequency ramp control circuit 102, the calculated temporary first and second ramp control values stored in the temporary registers 108 are sent to the frequency adjustment module 126 in a single step frequency adjustment value stream 122. The frequency adjustment module 126 receives the system clock signal 124, and the dual edge clock mux 126 applies the frequency adjustment values 122 to the system clock signal 124 to generate the output clock signal 130. The frequency of the system clock signal 124 is different than the frequency of the output clock signal 130 and the duty cycle of the system clock signal 124 is within a tolerance range of the output clock signal 130. In a particular embodiment, the output clock signal 130 satisfies a minimum pulse width tolerance as the output clock signal 130 ramps through a series of frequency adjustment steps to a target frequency. For example, when the output clock signal 130 has a frequency approximately one-half the frequency of the system clock signal 124, the minimum pulse width tolerance may be t/2, where t is a period of the system clock signal 124. At lower frequencies, the minimum pulse width tolerance may increase to 3t/2, as an illustrative, non-limiting example. The duty cycle tolerance range or the minimum pulse width tolerance, or both, may depend on the specific devices or processors that use the output clock signal 130.

Some devices can handle a relatively large shift in the clock signal while other devices can only handle a small shift in the clock signal. If the shift in a clock signal is too great or more than a device can handle, there may be a sudden change or changes in the rate of current supply while switching from one clock signal to another and the resulting voltage drop could lead to a functional failure of the device. By controlling the frequency adjustment value according to an algorithm such as the Manhattan algorithm that will be described below, the frequency of the output clock signal 130 changes gradually and sudden changes in the rate of current supply may be avoided.

In a particular embodiment, the system clock signal 124 has a first frequency and first duty cycle and in response to the first single step frequency adjustment, the output signal 130 has a second frequency and a second duty cycle. The calculated temporary first and second ramp control values calculated by the single step increment calculation module 104 are used to send a second single step frequency adjustment to the frequency adjustment module 126. The frequency adjustment module 126 applies the second single step frequency adjustment values 122 to the system clock signal 124 to generate a third signal having a third frequency. The third signal has a third duty cycle within the tolerance range of the second duty cycle. In a particular embodiment, the tolerance range indicates a duty cycle of each frequency step of the output signal 130, such as a duty cycle in a range between about 0.4 to about 0.6 as an illustrative example. In another particular embodiment, the duty cycle tolerance range indicates an acceptable change in duty cycles between successive frequency steps, such as less than a 50% change in duty cycle between steps, as an illustrative example.

In a particular embodiment, the output from the single step increment calculation module 104 is a smaller change than a total frequency change from the initial first ramp control value 110 and initial second ramp control value 114 to the target first ramp control value 112 and the target second ramp control value 116. To illustrate, a frequency transition to the target frequency may be performed by a series of iterative steps of intermediate frequency values to more smoothly ramp to the target frequency. For example, the first and second ramp control values may correspond to a numerator and denominator of a fractional value to be applied to the system clock signal 124. Frequencies two through six illustrate how output signal 130 transitions from the second frequency to the sixth frequency. During each transition, each change in frequency is less than a maximum change of frequency and the duty cycle of each transition is within a tolerance range. The pulse width of each transition may also satisfy a pulse width tolerance. For example, the duty cycle is the duration that the function is active high divided by the period of the function and the duty cycle of an ideal square wave is 0.5. The duty cycle tolerance range for a square wave may be about twenty percent, or between about 0.4 to about 0.6.

In a particular embodiment, the calculated temporary first and second ramp control values from the single step increment calculation module 104 are controlled such that only the first value or the second value changes at any one time. For example, the calculated temporary first and second ramp control values may be obtained by using a Manhattan algorithm, as will be described with respect to FIG. 3. Once the calculated temporary first ramp control value has reached or is equal to the target first ramp control value 112 and the second ramp control value has reached or is equal to the target second ramp control value 116, the ramp complete logic 106 generates a ramp complete signal 118. The ramp complete signal 118 indicates that the ramping of the clock signal is completed. In a particular embodiment, the ramp complete signal 118 is transmitted to a device that provides an indication or notification that the ramping of the clock signal is complete. In a particular embodiment, the ramp complete signal 118 is a polling/interrupt signal sent to a host processor that is controlling the ramping of the clock signal.

By incrementally traversing the ramp control values from the initial first ramp control value 110 to the target first ramp control value 112 and the initial second ramp control value 114 to the target second ramp control value 116, a sudden change or changes in the rate of current supply while switching from one clock rate to another may be avoided and a voltage drop that could lead to a functional failure of a device may be prevented.

Figure 2:
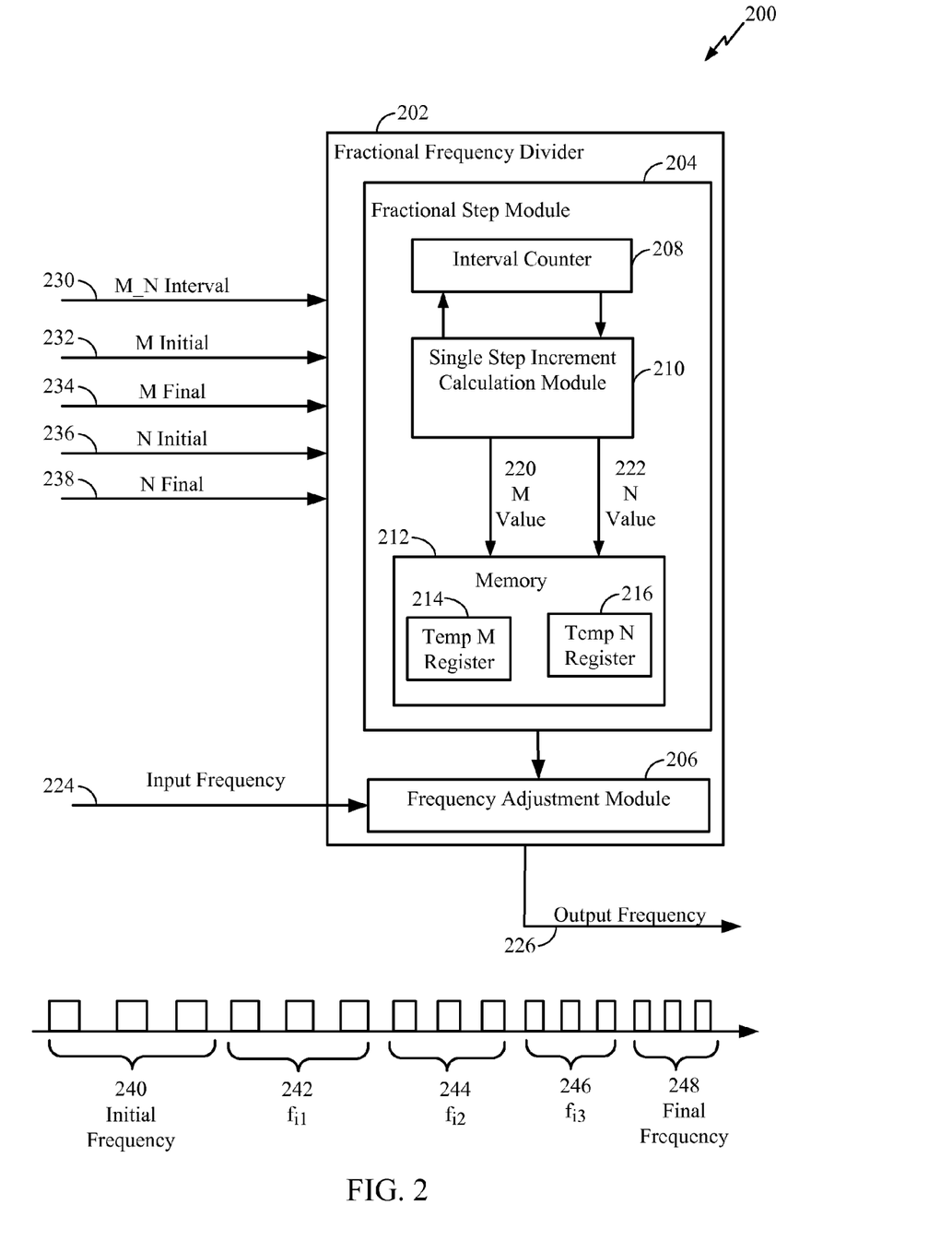
FIG. 2 is a block diagram of a second illustrative embodiment of a system to fractionally divide a clock signal.

Referring to FIG. 2, an illustrative second embodiment of a system to fractionally divide a signal frequency is depicted and generally designated 200. The system 200 includes a fractional frequency divider 202. The fractional frequency divider 202 contains a fractional step module 204 and a frequency adjustment module 206. The fractional step module 204 contains an interval counter 208, a single step increment calculation module 210, and a memory 212 that contains temporary M register 214 and temporary N register 216.

The fractional frequency divider 202 receives an M/N interval 230, an M initial value 232, an M final value 234, an N initial value 236, and an N final value 238. The interval counter 208 uses the M/N interval 230 to determine when to send a signal to the single increment calculation module 210 to change an M intermediate value 220 or an N intermediate value 222. The single increment calculation module 210 is responsive to the M initial value 232, the M final value 234, the N initial value 236, and the N final value 238. Using a frequency adjustment calculation such as a Manhattan algorithm, the single increment calculation module 210 calculates each M intermediate value 220 and each N intermediate value 222.

Once the M intermediate value 220 is calculated, it is sent to the temporary M register 214 in the memory 212. Once the N intermediate value 222 is calculated, it is sent to the temporary N register 216 in the memory 212. The frequency adjustment module 206 uses the M intermediate value 220 in the temporary M register 214 and the N intermediate value 222 in the temporary N register 216 to generate a frequency adjustment value. The frequency adjustment value is applied to an input clock signal having an input frequency 224 to generate an output signal having a frequency 226 where the input frequency 224 is different than the output frequency 226 and the pulse width of the output signal having the output frequency 226 satisfies a pulse width tolerance. In a particular embodiment, the duty cycle of the input clock signal having the input frequency 224 is within a tolerance range of the output signal having the output frequency 226.

The duty cycle and/or pulse width tolerance range may depend on the specific devices or processors that use the output signal having the output frequency 226. In addition, if the frequency shift in the output frequency 226 is too great or more than a device can handle, there may be a sudden change or changes in the rate of current supply while switching from one output frequency 226 to another and the resulting voltage drop could lead to a functional failure of the device. By keeping the frequency step size of the output frequency 226 within a tolerance range, sudden changes in the rate of current supply may be avoided. The system 200 enables a smooth transition of processor clock frequencies in order to avoid sudden changes in rate of current supply (Mt) while switching from one clock rate to another which could result in a voltage drop leading to functional failure of a device that contains the system 200. In a particular embodiment, the output signal generated based on the M intermediate value 220 and the N intermediate value 222 has a duty cycle that is close to fifty percent so that timing is met for circuits that operate on both clock edges like processor cores for M/N ratios less than 0.5.

The interval counter 208 changes the M intermediate value 220 and the N intermediate value 222 until the M intermediate value 220 is equal to the M final value 234 and the N intermediate value 222 is equal to the N final value 238. During the transition, the output frequency 226 may change from an initial frequency 240 to a first intermediate frequency 242, from the first intermediate frequency 242 to a second intermediate frequency 244, from the second intermediate frequency 244 to a third intermediate frequency 246, and from the third intermediate frequency 246 to a final frequency 248 where the M intermediate value 220 is equal to the M final value 234 and the N intermediate value 222 is equal to the N final value 238.

In a particular embodiment, only the M value or the N value changes at any one time and each M value and N value is calculated using a Manhattan algorithm. For example, a table 300 similar to the one shown in FIG. 3 may be used to determine the M value stored in the temporary M register 214 and the N value stored in the temporary N register 216. If the initial frequency is half the input frequency 224, then the initial M value 232 may be 7 and the initial N value 236 may be 14 such that M/N (7/14) multiplied by the input frequency 224 results in the output frequency 226 being half the input frequency 224. Then, if the desired output frequency 226 is one quarter of the input frequency 224, the final M value 234 may be 3 and the final N value 238 may be 12 such that M/N (3/12) multiplied by the input frequency 224 results in the output frequency 226 being one quarter of the input frequency 224. To traverse table 300 from an initial M value of 7 to a final M value of 3, and an initial N value of 14 to a final N value of 12, only one M or N value is changed with each frequency change. For example, if the initial frequency is half the input frequency 224 and the initial M value 232 is 7 and the initial N value 236 is 14, then the first intermediate frequency may be created by have the M intermediate value 220 equal to 7 while the N intermediate value 222 is equal to 13. Alternatively, the first intermediate frequency may be created by changing the M intermediate value 220 to 6 while the N intermediate value 222 is equal to 14. In either case, only the M value or N value has changed and the table continues to be traversed by changing only the M value or N value with each traverse until the intermediate M value 220 equals the M final value 234 and the intermediate N value 222 equals the N final value 238.

Figure 3:
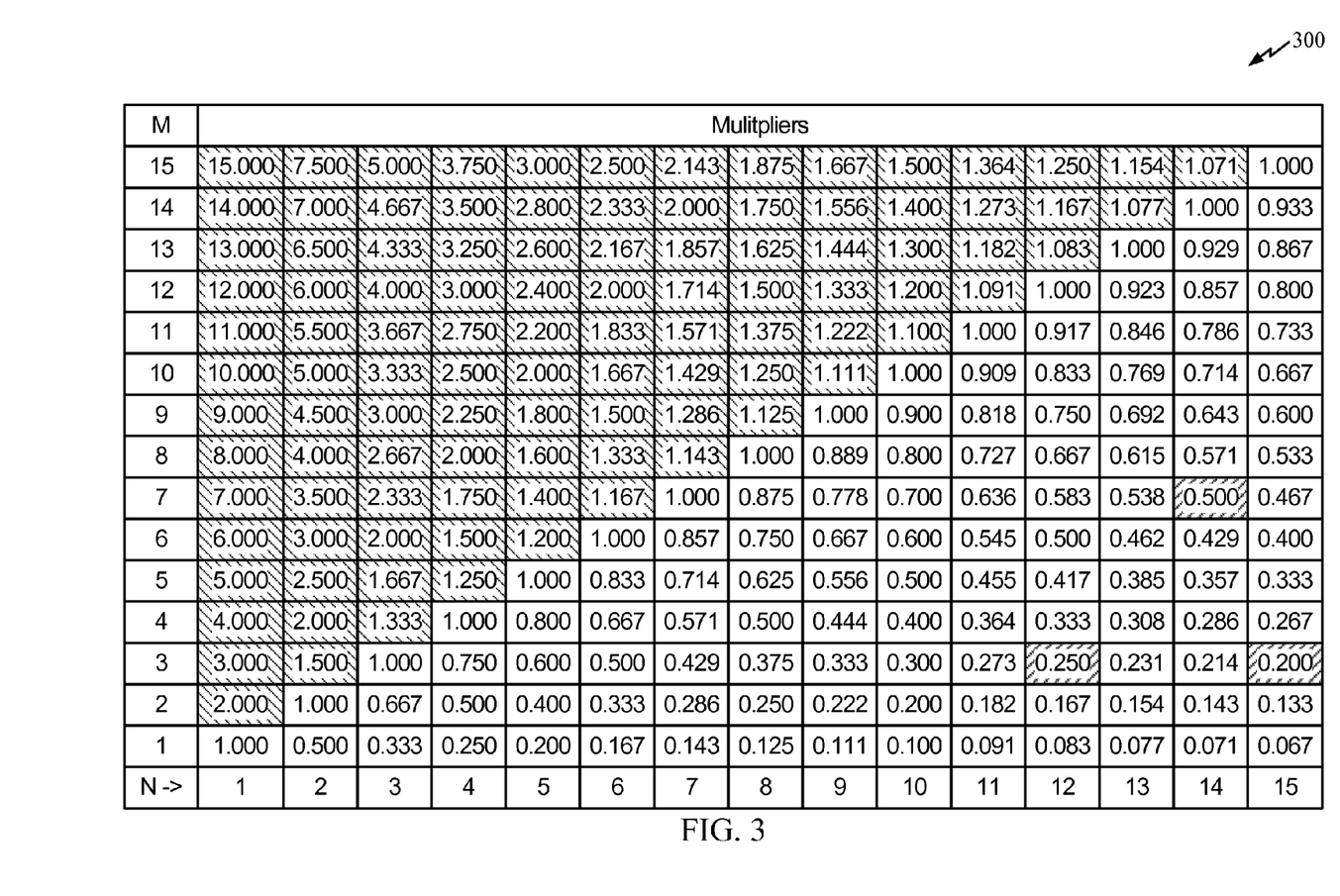
FIG. 3 is a table having M and N values that illustrate how the system of FIG. 2 may incrementally change clock frequencies to fractionally divide a clock signal.

Referring to FIG. 3, a table to generate M and N values is depicted and generally designated 300. The table 300 includes N values on an X-axis, M values on a Y-axis, and M/N values in the table cells. Shaded cells represent M/N values greater than one which may not be allowed in some implementations. The table 300 allows for M and N generation using a Manhattan algorithm ramping scheme. The Manhattan algorithm ramping scheme traverses the table 300 of values between the initial and final values in a Manhattan step fashion. For example, traverse X-axis from an initial N-value to a final N-value and then traverse the Y-axis from an initial M-value to a final M-value, or vice-versa. The table 300 is an example table of values for a hypothetical 4-bit case (i.e. M and N between 0-15) but could be greater than or less than a 4-bit case.

Figure 4:
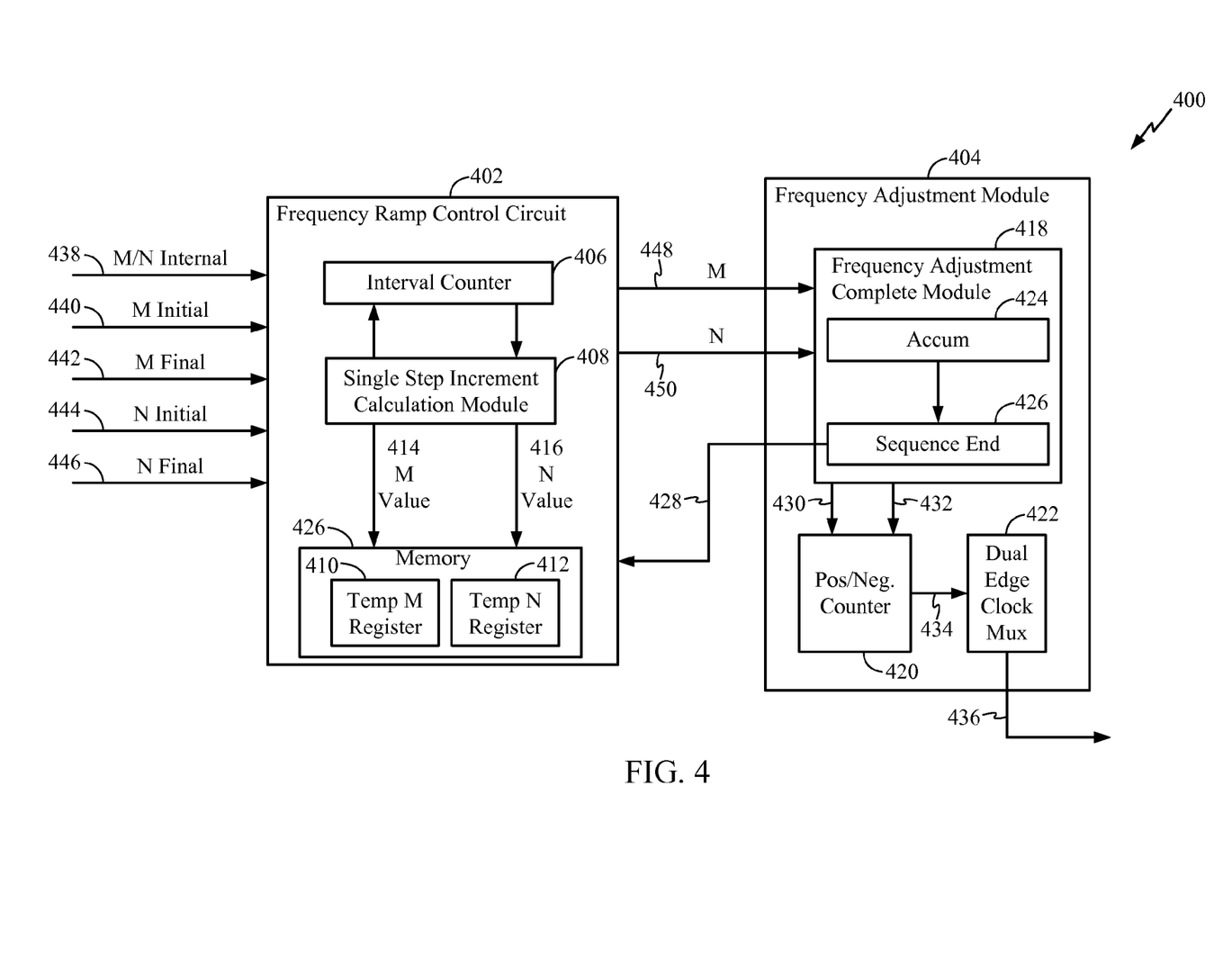
FIG. 4 is a block diagram of a third illustrative embodiment of a system to fractionally divide a clock signal.

Referring to FIG. 4, a third particular illustrative embodiment of a system to fractionally divide a clock signal is depicted and generally designated 400. The system 400 includes a frequency ramp control circuit 402 and a frequency adjustment module 404. The ramp control circuit 402 includes an interval counter 406, a single step increment calculation module 408, and a memory 426 that contains temporary M register 410 and a temporary N register 412.

The ramp control circuit 402 receives M/N interval 438, M initial value 440, M final value 442, N initial value 444, and N final value 446. The interval counter 406 uses the M/N interval 438 to determine when to send a signal to the single increment calculation module 408 to change an M intermediate value 414 or an N intermediate value 416. The single increment calculation module 408 is responsive to the M initial value 440, the M final value 442, the N initial value 444, and the N final value 446. Using a frequency adjustment calculation, the single increment calculation module 408 calculates the M intermediate value 414 and the N intermediate value 416. For example, the single increment calculation module 408 can calculate a sequence of M and N value pairs to ramp the output signal from the initial frequency to the final frequency via a series of intermediate frequency steps. The intermediate M and N values may be determined by incrementally walking through the table 300 of FIG. 3, such as via a Manhattan algorithm, to ensure a frequency change between each successive step is within a circuit tolerance.

Once the M intermediate value 414 is calculated, it is sent to the temporary M register 410 in the memory 426. Once the N intermediate value 416 is calculated, it is sent to the temporary N register 412 in the memory 426. The M intermediate value 414 and the N intermediate value 416 change incrementally until the M intermediate value 414 is equal to the M final value 442 and the N intermediate value 416 is equal to the N final value 446. Upon receiving a handshake 428 from the frequency adjustment module 404, the ramp control circuit 402 sends an M value 448 and an N value 450 to the frequency adjustment module 404. The M value 448 is the M intermediate value 414 stored in the temporary M register 410, and the N value 450 is the N intermediate value 416 stored in the temporary N register 412.

The frequency adjustment module 404 receives the M value 448 and the N value 450 and contains a frequency adjustment complete module 418, positive/negative counter 420, and dual edge clock mux 422. The frequency adjustment complete module 418 contains an accumulator 424 and a sequence end module 426. The accumulator 424 counts the number of pulses of the input clock and outputs the number to the sequence end module 426. The sequence end module 426 determines if the number of pulses of the input clock equals the M value 448 subtracted from the N value 450. If the number of pulses of the input clock equals the M value 448 subtracted from the N value 450, the sequence end module 426 sends the handshake 428 to the frequency ramp control circuit 402 and a new M value 448 and/or a new N value 450 is sent to the frequency adjustment module 404. In a particular embodiment, only one M value 448 or one N value 450 changes at a time.

The frequency adjustment complete module 418 also sends a positive value signal 430 or a negative value signal 432 to the positive/negative counter 420. The positive value signal 430 is sent when the input clock signal is high and the negative value signal 432 is sent when the input clock signal is low. The positive/negative counter 420 sends a signal 434 to the dual edge clock mux 422 that allows the dual edge clock mux 422 to output transitions from high to low or low to high to generate a clock signal 436 where the duty cycle of the clock signal 463 is within a tolerance range of a previous clock signal.

Figure 5:
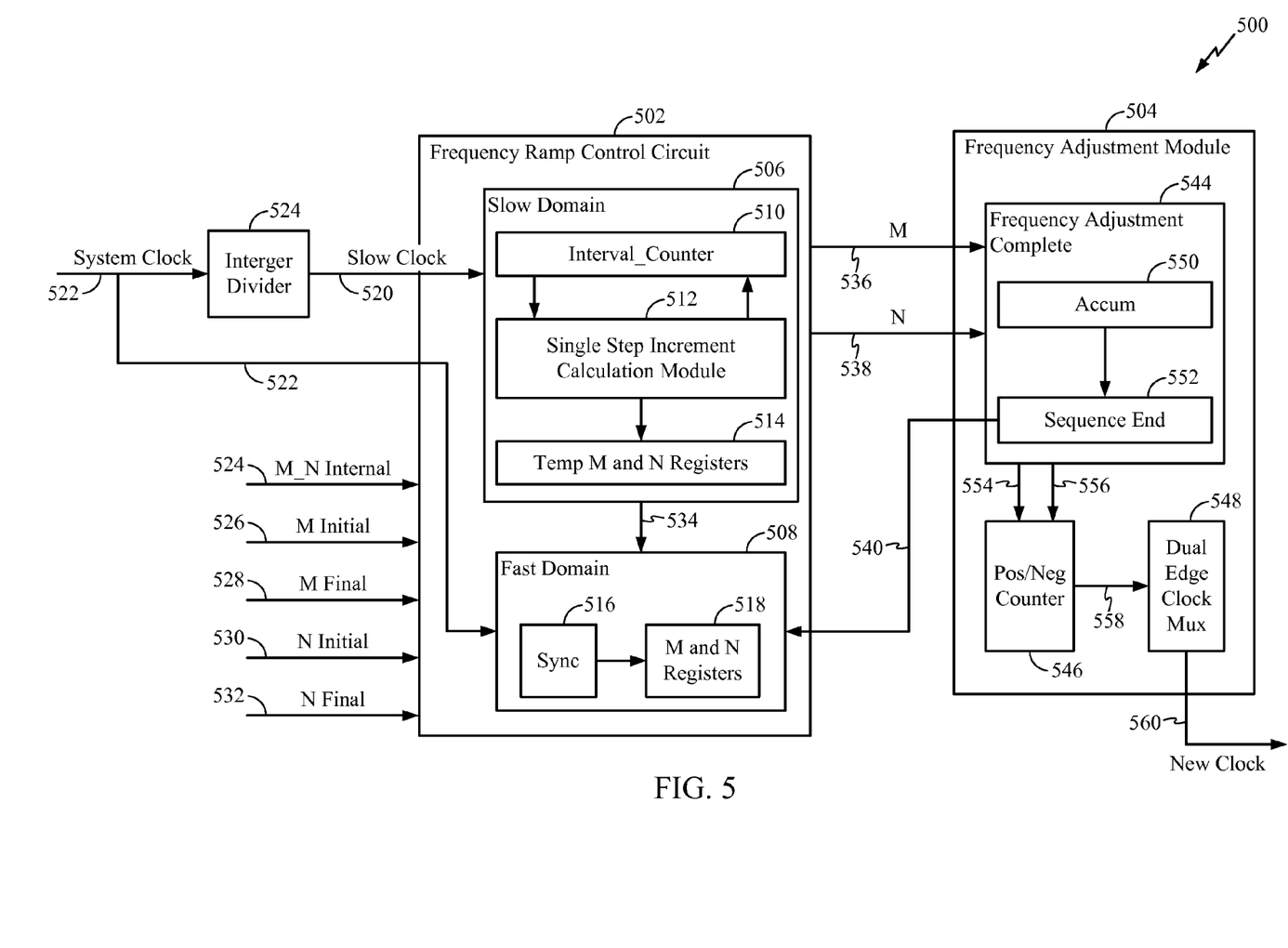
FIG. 5 is a block diagram of a ramp control circuit that may be used by the system of FIG. 4.

Referring to FIG. 5, a fourth particular illustrative embodiment of a system to fractionally divide a clock signal is depicted and generally designated 500. The system 500 includes a frequency ramp control circuit 502 and a frequency adjustment module 504. The ramp control circuit 502 includes a slow domain 506 and a fast domain 508. The slow domain 506 includes an interval counter 510, a single step increment calculation module 512, and temporary M and N registers 514. The fast domain 508 contains a synchronization module 516 and M and N registers 518.

The slow clock domain 506 uses a slow clock signal 520 because the processing inside the slow clock domain 506 can be heavy in logic or computationally intensive and timing can be met by using the slow clock signal 520. An integer divider 524 creates the slow clock signal 520 by modifying a system clock signal 522. The integer divider 524 may be a Miller frequency divider, a digital divider, or any other circuit that can reduce the frequency of the system clock signal 522 to produce the slow clock signal 520. In a particular embodiment, the system clock signal 522 is divided by four to create the slow clock signal 520.

The slow domain 506 receives an M/N interval 524, an M initial value 526, an M final value 528, an N initial value 530, and an N final value 532. The interval counter 510 uses the M/N interval 524 to determine when to send a signal to the single increment calculation module 512 to change an M intermediate value or an N intermediate value. The single increment calculation module 512 is responsive to the M initial value 526, the M final value 528, the N initial value 530, and the N final value 532. Using a frequency adjustment calculation, the single increment calculation module 512 calculates the M intermediate value and the N intermediate value and sends the calculated values to the temporary M and N registers 514. Once the M intermediate value and the N intermediate value are in the temporary M and N registers 514, the synchronizer 516 synchronizes a signal 534 from the slow domain 506 to the frequency of the system clock signal 522 and stores the M intermediate value and the N intermediate value in M and N registers 518. In response to a next M and N value signal 540 from the frequency adjustment module 504, the frequency ramp control circuit 502 sends an M value 536 and an N value 538 to the frequency adjustment module 504.

The frequency adjustment module 504 contains a frequency adjustment complete module 544, a positive/negative counter 546, and a dual edge clock mux 548. The frequency adjustment complete module 544 contains an accumulator 550 and a sequence end module 552. The accumulator 550 counts the number of pulses of the input clock and outputs the number to the sequence end module 552. The sequence end module 552 determines if the number of pulses of the input clock equals the M value 536 subtracted from the N value 538. If the number of pulses of the input clock equals the M value 536 subtracted from the N value 538, the sequence end module 552 sends the next M and N value signal 540 to the frequency ramp control circuit 502, and a new M value 536 and a new N value 538 is sent to the frequency adjustment module 504 if the updated values are available. In a particular embodiment, the updated values are available after a calculation using a Manhattan algorithm. In a particular embodiment, only one M value or one N value changes at a time.

In one particular embodiment, the frequency adjustment complete module 544 also sends a positive value signal 554 or a negative value signal 556 to the positive/negative counter 546. The positive value signal 554 is sent when the input clock signal has a logical one value ("high") and the negative value signal 556 is sent when the input clock signal has a logical zero value ("low"). The positive/negative counter 546 sends a signal 558 to the dual edge clock mux 548 that allows the dual edge clock mux 548 to output transitions from high to low or low to high to generate a clock signal 560 where the duty cycle of the clock signal 560 is within a tolerance range of the previous clock signal. For example, the dual edge clock mux 548 may ensure that the leading edge of the clock signal 560 for a single step increment coincides with the leading edge of the clock signal for the previous step or that the trailing edge of the clock signal 560 for a single step increment coincides with the trailing edge of the clock signal for the previous step. In another particular embodiment, the frequency adjustment module 504 does not include the positive/negative counter 546 and instead positive level and negative level signals are generated from control logic and then fed to the dual edge clock mux 548. The frequency adjustment complete module 544 enables the duty cycle of the clock signal 560 to be within a tolerance range of a previous clock signal, as opposed to other techniques such as pulse swallowing that may cause the logical one value to be much shorter than the logical zero value and thus may limit the operation of the circuit using the clock signal.

Figure 6:
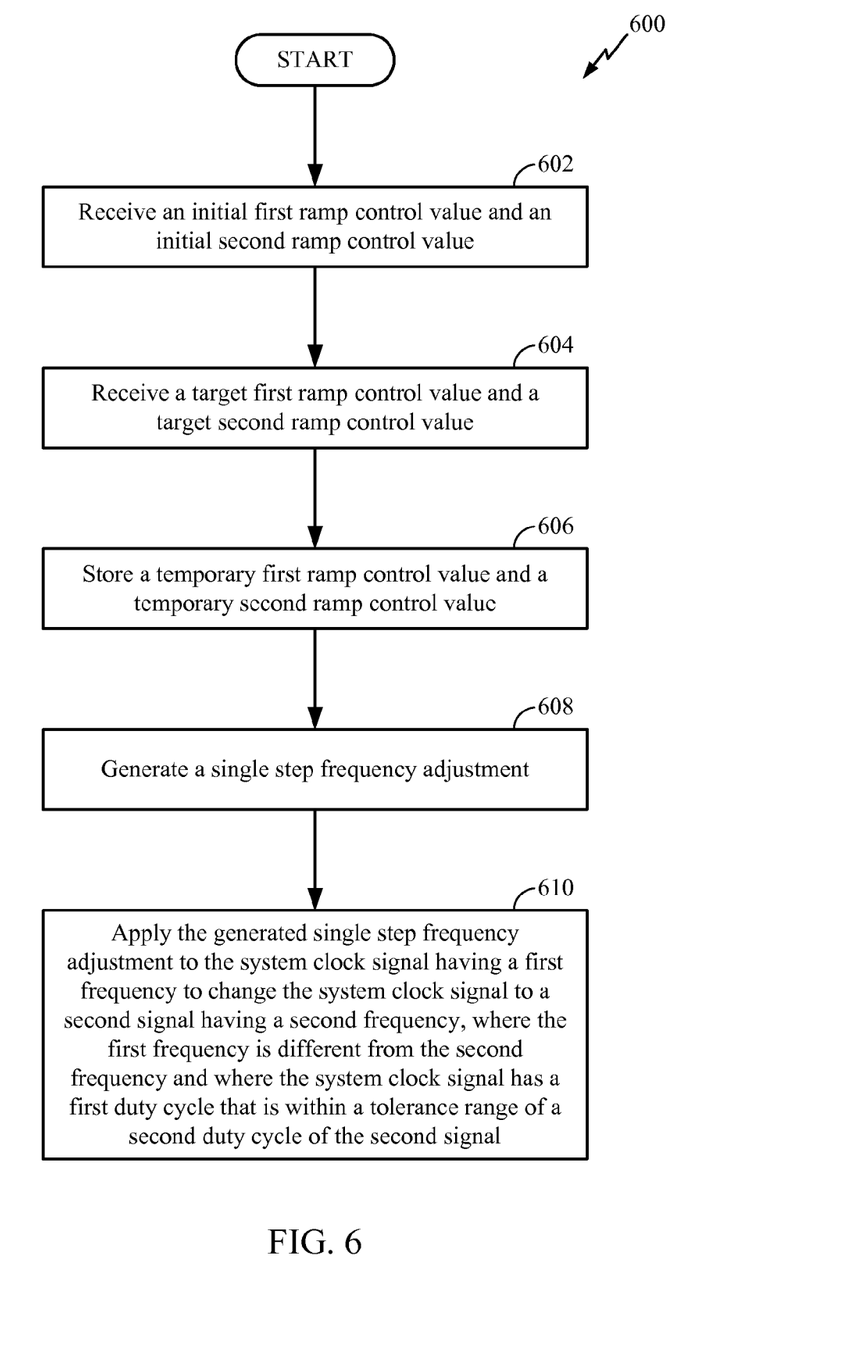
FIG. 6 is a flow chart of an illustrative embodiment of a method of fractionally dividing a clock signal.

Referring to FIG. 6, a particular illustrative embodiment of a method of fractionally dividing a clock signal is depicted and generally designated 600. In an illustrative embodiment, the method 600 may be performed by the system 100 of FIG. 1, the system 200 of FIG. 2, the system 300 of FIG. 3, the system 400 of FIG. 4, or the system 500 of FIG. 5.

In a particular embodiment, at 602, an initial first ramp control value and an initial second ramp control value are received. For example, the initial first ramp control value 110 and the initial second ramp control value 114 may be received at the first input 132, as shown in FIG. 1. Continuing to 604, a target first ramp control value and a target second ramp control value are received. For example, the target first ramp control value 112 and the target second ramp control value 116 may be received at the second input 134, as shown in FIG. 1. Moving to 606, a temporary first ramp control value and a temporary second ramp control value are stored. For example, the calculated first and second ramp control values 138 are stored in the memory 136, as shown in FIG. 1. Continuing to 608, a single step frequency adjustment is generated. For example, the frequency adjustment module 126 uses the M/N value stream 122 to generate a single step frequency adjustment, as shown in FIG. 1. Moving to 610, the generated single step frequency adjustment is applied to the system clock signal having a first frequency to change the system clock signal to a second clock signal having a second frequency. The first frequency is different from the second frequency, and the system clock signal has a first duty cycle that is within a tolerance range of a second duty cycle of the second signal. For example, the dual edge clock mux 128 applies the single step frequency adjustment to the clock 124 to produce an output clock 130 where the frequency of the clock 124 is different from the frequency of the output clock 130 and the duty cycle of the clock 124 is within a tolerance range of the duty cycle of the output clock 124. In a particular embodiment, the temporary first ramp control value and the temporary second ramp control value change incrementally until the temporary first ramp control value is equal to the target first ramp control value and the temporary second ramp control value is equal to the target second ramp control value. For example, the M intermediate value 414 and the N intermediate value 416 change incrementally until the M intermediate value 414 is equal to the M final value 442 and the N intermediate value 416 is equal to the N final value 446, as shown in FIG. 4.

Figure 7:
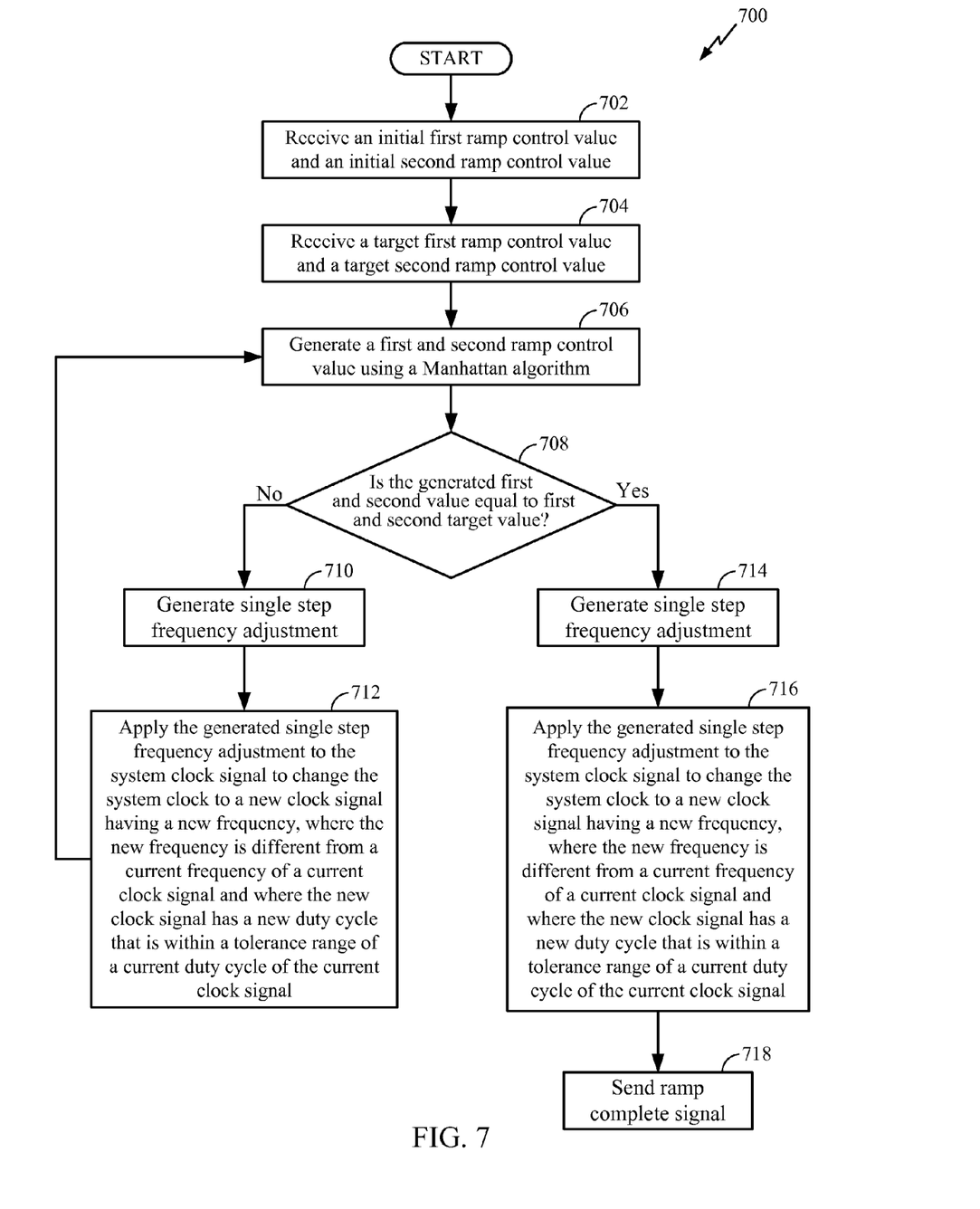
FIG. 7 is a flow chart of a second illustrative embodiment of a method of fractionally dividing a clock signal.

Referring to FIG. 7, a particular illustrative embodiment of a method of fractionally dividing a clock signal is depicted and generally designated 700. In an illustrative embodiment, the method 700 may be performed by the system 100 of FIG. 1, the system 200 of FIG. 2, the system 300 of FIG. 3, the system 400 of FIG. 4, or the system 500 of FIG. 5.

In a particular embodiment, at 702, an initial first ramp control value and an initial second ramp control value are received. For example, the initial first ramp control value 110 and the initial second ramp control value 114 may be received at the first input 132, as shown in FIG. 1. Continuing to 704, a target first ramp control value and a target second ramp control value are received. For example, the target first ramp control value 112 and the target second ramp control value 116 may be received at the second input 134, as shown in FIG. 1. Moving to 706, a Manhattan algorithm is used to generate a temporary first ramp control value and a temporary second ramp control value. For example, the single step increment calculation module 104 may use a Manhattan algorithm to generate the calculated first and second ramp control values 138, as shown in FIG. 1.

Continuing to 708, a determination is made whether the generated first ramp control value is equal to the target first ramp control value and the second ramp control value is equal to the target second ramp control value. For example, the ramp complete logic 106 may determine if the generated first ramp control value is equal to the target first ramp control value and the second ramp control value is equal to the target second ramp control value, as shown in FIG. 1.

Continuing to 710, if the generated first ramp control value is not equal to the target first ramp control value and the second ramp control value is not equal to the target second ramp control value, then a single step frequency adjustment is generated from the first ramp control value and the second ramp control value. For example, the frequency adjustment module 126 uses the M/N value stream 122 to generate a single step frequency adjustment, as shown in FIG. 1. Moving to 712, the generated single step frequency adjustment is applied to the system clock signal to change the system clock signal to an adjusted clock having an adjusted frequency, wherein the adjusted frequency is different from a current frequency of a current clock and wherein the adjusted clock has an adjusted duty cycle that is within a tolerance range of a current duty cycle of the current. For example, the dual edge clock mux 128 applies the single step frequency adjustment to the clock 124 to produce output clock signal 130 where the frequency of the clock signal 124 is different from the output clock signal 130 and the duty cycle of the clock signal 124 is within a tolerance range of the output clock signal 130.

Continuing to 714, if the generated first ramp control value is equal to the target first ramp control value and the second ramp control value is equal to the target second ramp control value, then a single step frequency adjustment is generated from the first ramp control value and the second ramp control value. For example, the frequency adjustment module 126 uses the M/N value stream 122 to generate a single step frequency adjustment, as shown in FIG. 1. Moving to 716, the generated single step frequency adjustment is applied to the system clock signal to change the system clock signal to a new clock having a new frequency, wherein the new frequency is different from a current frequency of a current clock and wherein the new clock has a new duty cycle that is within a tolerance range of a current duty cycle of the current. For example, the dual edge clock mux 128 applies the single step frequency adjustment to the clock 124 to produce output clock 130 where the frequency of the clock 124 is different from the output clock 130 and the duty cycle of the clock 124 is within a tolerance range of the output clock 124. Continuing to 718, a ramp complete signal is sent. For example, the ramp complete signal 118 is sent by the ramp control circuit 102 when the generated first ramp control value is equal to the target first ramp control value and the second ramp control value is equal to the target second ramp control value, as shown in FIG. 1.

Figure 8:
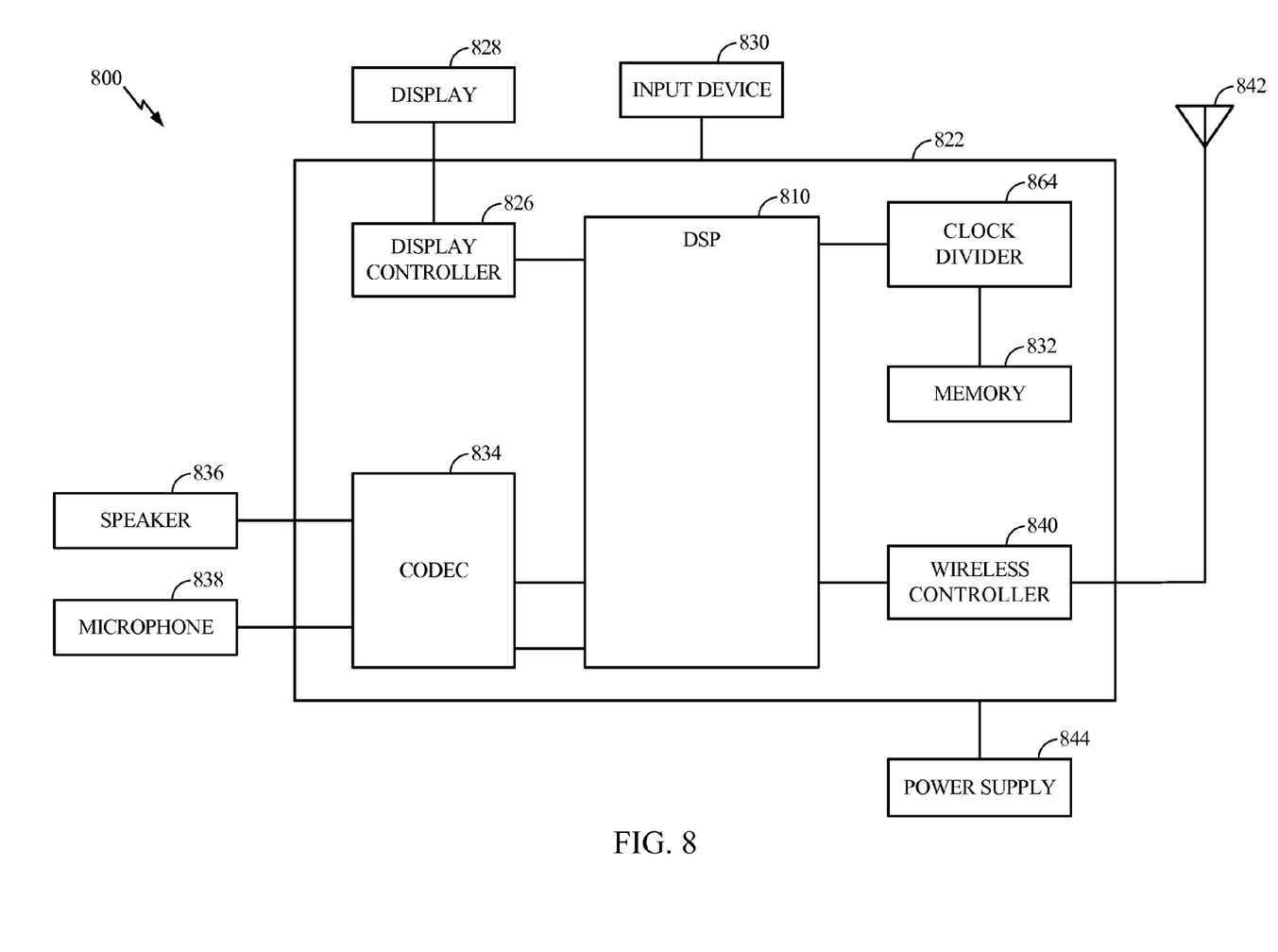
FIG. 8 is a block diagram of an illustrative communication device that includes a ramp control circuit.

FIG. 8 is a block diagram of an illustrative embodiment of a wireless communication device. The wireless communications device 800 includes a digital signal processor (DSP) 810 that communicates with a clock divider 864 generated by the system 100 of FIG. 1, the system 200 of FIG. 2, the system 300 of FIG. 3, the system 400 of FIG. 4, or the system 500 of FIG. 5 in accordance with the method 600 of FIG. 6, the method 700 of FIG. 7, or any combination thereof. In a particular embodiment, the clock divider 864 may be used with any or all of the components of the wireless communication device 800 while switching from one clock rate to another to avoid a sudden change or changes in the rate of current supply to one or more components of the device 800 that could lead to a functional failure of the wireless communication device 800. Wireless communication device 800 may be a cellular phone, a terminal, a handset, a personal digital assistant ("PDA"), a wireless modem, or other wireless device. The wireless communication device may be used with a wireless communication system such as a Code Division Multiple Access (CDMA) system, a Global System for Mobile Communications (GSM) system, or similar communication system.

FIG. 8 also indicates that a display controller 826 is coupled to the DSP 810 and to a display 828. Additionally, a memory 832 is coupled to the DSP 810. A coder/decoder (CODEC) 834 is also coupled to the DSP 810. A speaker 836 and a microphone 838 are coupled to the CODEC 834. Also, a wireless controller 840 is coupled to the DSP 810 and to a wireless antenna 842. In a particular embodiment, a power supply 844 and an input device 830 are coupled to an on-chip system 822. In a particular embodiment, as illustrated in FIG. 8, the display 828, the input device 830, the speaker 836, the microphone 838, the wireless antenna 842, and the power supply 844 are external to the on-chip system 822. However, each is coupled to a component of the on-chip system 822.

Figure 9:
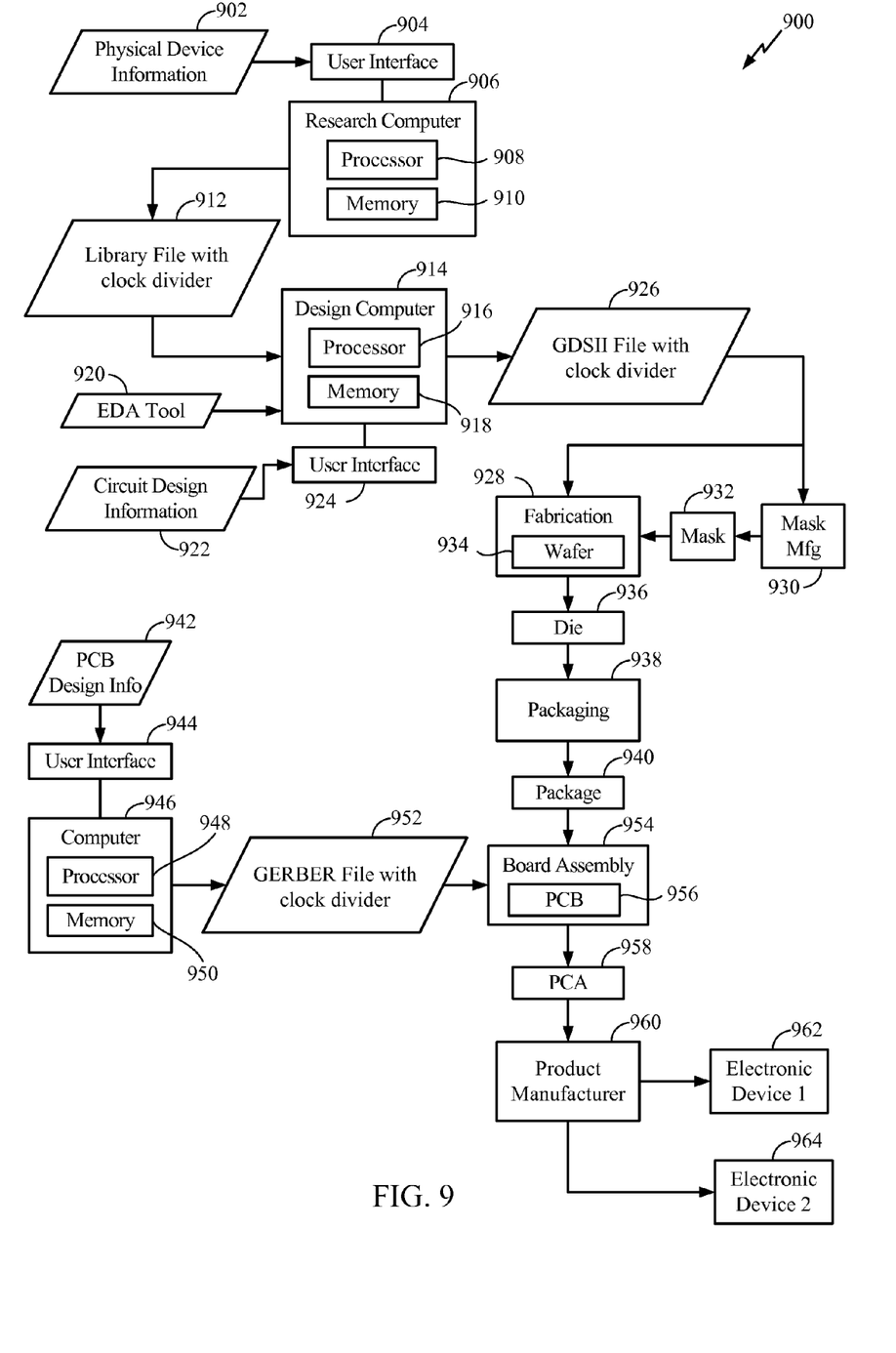
FIG. 9 is a block diagram of an illustrative embodiment of a manufacturing process that includes a ramp control circuit.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 9 depicts a particular illustrative embodiment of an electronic device manufacturing process 900.

Physical device information 902 is received in the manufacturing process 900, such as at a research computer 906. The physical device information 902 may include design information representing at least one physical property of a clock divider used in a semiconductor device, such as the clock divider of FIG. 1, FIG. 2, FIG. 3, FIG. 4, or FIG. 5. For example the physical device information 902 may include physical parameters, material characteristics, and structure information that is entered via a user interface 904 coupled to the research computer 906. The research computer 906 includes a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may include a library of semiconductor devices including the clock divider of FIG. 1, FIG. 2, FIG. 3, FIG. 4, or FIG. 5 that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit using the clock divider of FIG. 1, FIG. 2, FIG. 3, FIG. 4, or FIG. 5, of the library file 912. For example, a user of the design computer 914 may enter circuit design information 922 via a user interface 924 coupled to the design computer 914. The circuit design information 922 may include design information representing at least one physical property of a semiconductor device, such as the clock divider of FIG. 1, FIG. 2, FIG. 3, FIG. 4, or FIG. 5. To illustrate, the circuit design property may include identification of particular circuits and relationships to other elements in a circuit design, positioning information, feature size information, interconnection information, or other information representing a physical property of a semiconductor device.

The design computer 914 may be configured to transform the design information, including the circuit design information 922 to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the clock divider of FIG. 1, FIG. 2, FIG. 3, FIG. 4, or FIG. 5 in addition to other circuits or information. To illustrate, the data file may include information corresponding to a system-on-chip (SOC) that includes the clock divider of FIG. 1, FIG. 2, FIG. 3, FIG. 4, or FIG. 5 and that also includes additional electronic circuits and components within the SOC.

The GDSII file 926 may be received at a fabrication process 928 to manufacture the clock divider of FIG. 1, FIG. 2, FIG. 3, FIG. 4, or FIG. 5 according to transformed information in the GDSII file 926. For example, a device manufacture process may include providing the GDSII file 926 to a mask manufacturer 930 to create one or more masks, such as masks to be used for photolithography processing, illustrated as a representative mask 932. The mask 932 may be used during the fabrication process to generate one or more wafers 934, which may be tested and separated into dies, such as a representative die 936. The die 936 includes a circuit including the clock divider of FIG. 1, FIG. 2, FIG. 3, FIG. 4, or FIG. 5.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 910. A printed circuit board (PCB) tool may be stored as processor executable instructions at the memory 910 to process PCB design information 942 received from a user of the computer 946 via a user interface 944. The PCB design information 942 may include physical positioning information of a packaged semiconductor device on a circuit board, the packaged semiconductor device corresponding to the package 940 including the clock divider of FIG. 1, FIG. 2, FIG. 3, FIG. 4, or FIG. 5.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the clock divider of FIG. 1, FIG. 2, FIG. 3, FIG. 4, or FIG. 5. In other embodiments, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines for performing various steps of a PCB production process. The PCB 956 may be populated with electronic components including the package 940 to form a represented printed circuit assembly (PCA) 958.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof.

Thus, the clock divider of FIG. 1, FIG. 2, FIG. 3, FIG. 4, or FIG. 5 may be fabricated, processed, and incorporated into an electronic device, as described in the illustrative process 900. One or more aspects of the embodiments disclosed with respect to FIGS. 1-8 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof. Although various representative stages of production from a physical device design to a final product are depicted, in other embodiments fewer stages may be used or additional stages may be included. Similarly, the process 900 may be performed by a single entity, or by one or more entities performing various stages of the process 900.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a first input to receive an initial first ramp control value and an initial second ramp control value;
   a second input to receive a target first ramp control value and a target second ramp control value, the initial first ramp control value, the initial second ramp control value, the target first ramp control value, and the target second ramp control value collectively defining a desired ramp control adjustment of a system clock signal;
   a memory comprising a temporary first ramp control value register and a temporary second ramp control value register; and
   a single step increment calculation module responsive to the first ramp control values and the second ramp control values and comprising an output to generate a single step frequency adjustment, wherein in response to a frequency adjustment calculation, a calculated first ramp control value is stored in the temporary first ramp control value register and a calculated second ramp control value is stored in the temporary second ramp control value register, and wherein the generated single step frequency adjustment is applied to the system clock signal having a first frequency to change the system clock signal to a second clock signal having a second frequency, wherein the first frequency is different from the second frequency and wherein the system clock signal has a first duty cycle that is within a tolerance range of a second duty cycle of the second clock signal.

2. The apparatus of claim 1, wherein the single step increment calculation module generates the second single step frequency adjustment, the second single step frequency adjustment applied to the system clock signal to generate a third clock signal having a third frequency, wherein the third clock signal has a third duty cycle within the tolerance range of the second duty cycle.

3. The apparatus of claim 1, further comprising a frequency ramp complete logic circuit to determine when the temporary first and second ramp control values have reached the target ramp control values.

4. The apparatus of claim 1, wherein the tolerance range is less than twenty percent.

5. The apparatus of claim 1, wherein the first ramp control value is an M value and the second ramp control value is an N value and only the M value or the N value changes at any one time.

6. The apparatus of claim 1, wherein the output from the single step increment calculation module is a smaller change than a total frequency change requested.

7. The apparatus of claim 6, wherein the output is obtained using a Manhattan algorithm.

8. The apparatus of claim 1, further comprising an interval counter to determine when to change the first ramp control value or the second ramp control value to generate the single step frequency adjustment.

9. The apparatus of claim 1, integrated in at least one semiconductor device.

10. The apparatus of claim 9, further comprising a device, selected from the group consisting of a set top box, a music player, a video player, an entertainment unit, a navigation device, a communications device, a personal digital assistant (PDA), a fixed location data unit, and a computer, into which the semiconductor device is integrated.

11. An apparatus comprising:
   means for receiving an initial first ramp control value and an initial second ramp control value;
   means for receiving a target first ramp control value and a target second ramp control value, the initial first ramp control value, the initial second ramp control value, the target first ramp control value, and the target second ramp control value collectively defining a desired ramp control adjustment of a system clock signal; and
   means for generating a single step frequency adjustment, wherein in response to a frequency adjustment calculation, a calculated first ramp control value is stored in a temporary first ramp control value register and a calculated second ramp control value is stored in a temporary second ramp control value register, and wherein the generated single step frequency adjustment is applied to the system clock signal having a first frequency to change the system clock signal to a second clock signal having a second frequency, wherein the first frequency is different from the second frequency and wherein the system clock signal has a first duty cycle that is within a tolerance range of a second duty cycle of the second clock signal.

12. The apparatus of claim 11, integrated in at least one semiconductor device.

13. The apparatus of claim 12, further comprising a device, selected from the group consisting of a set top box, a music player, a video player, an entertainment unit, a navigation device, a communications device, a personal digital assistant (PDA), a fixed location data unit, and a computer, into which the semiconductor device is integrated.

14. A method comprising:
   receiving an initial first ramp control value and an initial second ramp control value;
   receiving a target first ramp control value and a target second ramp control value, the initial first ramp control value, the initial second ramp control value, the target first ramp control value, and the target second ramp control value collectively defining a desired ramp control adjustment of a system clock signal;
   generating a single step frequency adjustment, wherein in response to a frequency adjustment calculation, a calculated first ramp control value is stored in a temporary first ramp control value register and a calculated second ramp control value is stored in a temporary second ramp control value register; and
   applying the generated single step frequency adjustment to the system clock signal having a first frequency to change the system clock signal to a second clock signal having a second frequency, wherein the first frequency is different from the second frequency and wherein the system clock signal has a first duty cycle that is within a tolerance range of a second duty cycle of the second clock signal.

15. The method of claim 14, wherein receiving an initial first ramp control value and an initial second ramp control value, receiving a target first ramp control value and a target second ramp control value, storing a temporary first ramp control value register and a temporary second ramp control value register, and generating a single step frequency adjustment, are performed at a processor integrated into an electronic device.

16. The method of claim 14, further comprising determining when the temporary first and second ramp control values have reached the first and second target ramp control values.

17. The method of claim 14, wherein the tolerance range is less than about fifty percent.

18. The method of claim 14, wherein a Manhattan algorithm is used to generate the single step frequency adjustment.

19. The method of claim 14, further comprising using an interval counter to determine when to change the first ramp control value or the second ramp control value to generate the single step frequency adjustment.

20. The method of claim 14, wherein during generation of the single step frequency adjustment, a sequence end module uses a next value signal to synchronize a next single step frequency adjustment with a current intermediate frequency output of the clock generator to avoid distortion in a clock signal.

21. The method of claim 20, wherein the next single step frequency adjustment is synchronized using a synchronization signal that corresponds to the system clock signal and further comprising, comparing the system clock signal to the feedback signal.

22. The method of claim 21, wherein receiving the synchronization signal comprises receiving a predivided clock signal for a slow domain portion of a ramp control circuit.

23. A method comprising:
   a first step for receiving an initial first ramp control value and an initial second ramp control value;
   a second step for receiving a target first ramp control value and a target second ramp control value, the initial first ramp control value, the initial second ramp control value, the target first ramp control value, and the target second ramp control value collectively defining a desired ramp control adjustment of a system clock signal;
   a third step for generating a single step frequency adjustment, wherein in response to a frequency adjustment calculation, a calculated first ramp control value is stored in a temporary first ramp control value register and a calculated second ramp control value is stored in a temporary second ramp control value register; and
   a fourth step for applying the generated single step frequency adjustment to the system clock signal having a first frequency to change the system clock signal to a second clock signal having a second frequency, wherein the first frequency is different from the second frequency and wherein the system clock signal has a first duty cycle that is within a tolerance range of a second duty cycle of the second clock signal.

24. The method of claim 23, wherein the first step, the second step, and the third step are performed by a processor integrated into an electronic device.

25. A non-transitory computer readable medium storing instructions executable by a computer, the instructions comprising:
  instructions that are executable by the computer to receive an initial first ramp control value and an initial second ramp control value;
  instructions that are executable by the computer to receive a target first ramp control value and a target second ramp control value, the initial first ramp control value, the initial second ramp control value, the target first ramp control value, and the target second ramp control value collectively defining a desired ramp control adjustment of a system clock signal;
  instructions that are executable by the computer to generate a single step frequency adjustment, wherein in response to a frequency adjustment calculation, a calculated first ramp control value is stored in a temporary first ramp control value register and a calculated second ramp control value is stored in a temporary second ramp control value register; and
  instructions that are executable by the computer to apply the generated single step frequency adjustment to the system clock signal having a first frequency to change the system clock signal to a second clock signal having a second frequency, wherein the first frequency is different from the second frequency and wherein the system clock signal has a first duty cycle that is within a tolerance range of a second duty cycle of the second clock signal.

26. The non-transitory computer readable medium of claim 25, wherein the instructions are executable by a processor integrated in a device selected from the group consisting of a set top box, a music player, a video player, an entertainment unit, a navigation device, a communications device, a personal digital assistant (PDA), a fixed location data unit, and a computer.

27. A method comprising:
  receiving design information representing at least one physical property of a semiconductor device, the semiconductor device comprising:
    a first input to receive an initial first ramp control value and an initial second ramp control value;
    a second input to receive a target first ramp control value and a target second ramp control value, the initial first ramp control value, the initial second ramp control value, the target first ramp control value, and the target second ramp control value collectively defining a desired ramp control adjustment of a system clock signal;
    a memory comprising a temporary first ramp control value register and a temporary second ramp control value register; and
    a single step increment calculation module responsive to the first ramp control values and the second ramp control values and comprising an output to generate a single step frequency adjustment, wherein in response to a frequency adjustment calculation, a calculated first ramp control value is stored in the temporary first ramp control value register and a calculated second ramp control value is stored in the temporary second ramp control value register, and wherein the generated single step frequency adjustment is applied to the system clock signal having a first frequency to change the system clock signal to a second clock signal having a second frequency, wherein the first frequency is different from the second frequency and wherein the system clock signal has a first duty cycle that is within a tolerance range of a second duty cycle of the second clock signal;
  transforming the design information to comply with a file format; and
  generating a data file comprising the transformed design information.

28. The method of claim 27, wherein the data file comprises a GDSII format.

29. A method comprising:
  receiving a data file comprising design information corresponding to a semiconductor device; and
  fabricating the semiconductor device according to the design information, wherein the semiconductor device comprises:
    a first input to receive an initial first ramp control value and an initial second ramp control value;
    a second input to receive a target first ramp control value and a target second ramp control value, the initial first ramp control value, the initial second ramp control value, the target first ramp control value, and the target second ramp control value collectively defining a desired ramp control adjustment of a system clock signal;
    a memory comprising a temporary first ramp control value register and a temporary second ramp control value register; and
    a single step increment calculation module responsive to the first ramp control values and the second ramp control values and comprising an output to generate a single step frequency adjustment, wherein in response to a frequency adjustment calculation, a calculated first ramp control value is stored in the temporary first ramp control value register and a calculated second ramp control value is stored in the temporary second ramp control value register, and wherein the generated single step frequency adjustment is applied to the system clock signal having a first frequency to change the system clock signal to a second clock signal having a second frequency, wherein the first frequency is different from the second frequency and wherein the system clock signal has a first duty cycle that is within a tolerance range of a second duty cycle of the second clock signal.

30. The method of claim 29, wherein the data file comprises a GDSII format.

31. A method comprising:
  receiving design information comprising physical positioning information of a packaged semiconductor device on a circuit board, the packaged semiconductor device comprising a semiconductor device that comprises:
    a first input to receive an initial first ramp control value and an initial second ramp control value;
    a second input to receive a target first ramp control value and a target second ramp control value, the initial first ramp control value, the initial second ramp control value, the target first ramp control value, and the target second ramp control value collectively defining a desired ramp control adjustment of a system clock signal;
    a memory comprising a temporary first ramp control value register and a temporary second ramp control value register; and
    a single step increment calculation module responsive to the first ramp control values and the second ramp control values and comprising an output to generate a single step frequency adjustment, wherein in response to a frequency adjustment calculation, a calculated first ramp control value is stored in the temporary first ramp control value register and a calculated second ramp control value is stored in the temporary second ramp control value register, and wherein the generated single step frequency adjustment is applied to the system clock signal having a first frequency to change the system clock signal to a second clock signal having a second frequency, wherein the first frequency is different from the second frequency and wherein the system clock signal has a first duty cycle that is within a tolerance range of a second duty cycle of the second clock signal; and transforming the design information to generate a data file.

32. The method of claim 31, wherein the data file has a GERBER format.

33. A method comprising:

receiving a data file comprising design information comprising physical positioning information of a packaged semiconductor device on a circuit board; and manufacturing the circuit board configured to receive the packaged semiconductor device according to the design information, wherein the packaged semiconductor device comprises a semiconductor device that comprises:

a first input to receive an initial first ramp control value and an initial second ramp control value;

a second input to receive a target first ramp control value and a target second ramp control value, the initial first ramp control value, the initial second ramp control value, the target first ramp control value, and the target second ramp control value collectively defining a desired ramp control adjustment of a system clock signal;

a memory comprising a temporary first ramp control value register and a temporary second ramp control value register; and a single step increment calculation module responsive to the first ramp control values and the second ramp control values and comprising an output to generate a single step frequency adjustment, wherein in response to a frequency adjustment calculation, a calculated first ramp control value is stored in the temporary first ramp control value register and a calculated second ramp control value is stored in the temporary second ramp control value register, and wherein the generated single step frequency adjustment is applied to the system clock signal having a first frequency to change the system clock signal to a second clock signal having a second frequency, wherein the first frequency is different from the second frequency and wherein the system clock signal has a first duty cycle that is within a tolerance range of a second duty cycle of the second clock signal.

34. The method of claim 33, wherein the data file has a GERBER format.

35. The method of claim 33, further comprising integrating the circuit board into a device selected from the group consisting of a set top box, a music player, a video player, an entertainment unit, a navigation device, a communications device, a personal digital assistant (PDA), a fixed location data unit, and a computer.

* * * * *